United States Patent [19]

Glock et al.

[11] 4,200,918
[45] Apr. 29, 1980

[54] CONTROL CIRCUIT FOR THE ADAPTATION OF STORAGE CELLS IN BIPOLAR INTEGRATED CIRCUITS

[75] Inventors: Hans Glock, Odelzhausen-Höfa; Gerhard Hartel, Munich, both of Fed. Rep. of Germany

[73] Assignee: Siemens Aktiengesellschaft, Berlin & Munich, Fed. Rep. of Germany

[21] Appl. No.: 928,020

[22] Filed: Jul. 26, 1978

[30] Foreign Application Priority Data

Aug. 24, 1977 [DE] Fed. Rep. of Germany ....... 2738187

[51] Int. Cl.² ............................................. G11C 11/40
[52] U.S. Cl. ................................... 365/210; 307/238; 365/189
[58] Field of Search ....................... 365/189, 190, 210; 307/238

[56] References Cited

U.S. PATENT DOCUMENTS

| | | | |
|---|---|---|---|
| 3,959,781 | 5/1976 | Mehta et al. | 365/210 |
| 4,075,609 | 2/1978 | Millhollan | 365/210 |

OTHER PUBLICATIONS

"High Speed Bipolar Monolithic Memories" Frequency 29 (1975) 3 pp. 80–87.

*Primary Examiner*—Terrell W. Fears
*Attorney, Agent, or Firm*—Hill, Van Santen, Steadman, Chiara & Simpson

[57] ABSTRACT

A circuit arrangement is disclosed for several storage cells arranged on one bipolar memory block. The storage cells are addressable by bit and word lines. By a write-read control circuit and bit lines information content of the storage cells is changeable. A regulating circuit is provided having an additional simulation storage cell identical to the other storage cells. A reference potential connects to the regulating circuit and regulates the storage cells in accordance with the respective operating mode. This is accomplished by means of a potential impressed onto the write-read control circuit in such fashion that, independent of the manufacturing related variations of the characteristic curves of the current voltage characteristics of the storage cells, a cell current passing through the storage cell when a storage cell is actuated is established at a predetermined value.

6 Claims, 3 Drawing Figures

CONTROL CIRCUIT FOR THE ADAPTATION OF STORAGE CELLS IN BIPOLAR INTEGRATED CIRCUITS

BACKGROUND OF THE INVENTION

This invention concerns itself with a circuit arrangement for several storage cells which are positioned on the same bipolar memory chip which can be addressed by bit and word lines, and which can have their information content changed by a read-write control circuit through use of the bit lines.

Circuits for large scale integrated bipolar memory chips are generally already developed before the current voltage characteristic of the final storage cell can be determined by measurement techniques. In this fashion the total development time until the functional chips are available can be shortened considerable. Such an approach is, however, risky due to the fact that the drive voltage for the storage cells under certain circumstances might not be adjustable to an optimum value; this is, however, fundamental for the performance data of the integrated circuit memory. In addition, the cell characteristics will vary due to the production process itself even between chips of the same wafer.

SUMMARY OF THE INVENTION

It is an object of this invention to develop for a bipolar memory circuit a circuit arrangement which makes it possible to balance out the variations in the shape of the characteristics of the current-voltage line characteristic of a storage cell due to the variations caused by the manufacturing process in such fashion that the changes in cell characteristics do not effect the switch and read out characteristics of the storage cells. This objective is accomplished in accordance with the invention such that a control circuit is provided which by means of an additional simulation storage cell, which cell is identical in construction to the other storage cells, regulates the reference potential of the write-read control unit, corresponding to the memory cells. This control unit subjects the respective operating states to a potential derived from this reference potential in such a fashion that, independent of the manufacturing related variations of the characteristic curve of the current voltage characteristic of the storage cells when the storage cell is actuated, the cell current flowing through the storage cell attains a predetermined value.

In one of the specifically advantageous embodiments of the invention, simulation of the network of the word and bit activation arrangement is provided to actuate the simulation storage cell in analogy to the operation mode "ready". An adjustable resistor is also arranged in a bit-line branch leading to a simulated read amplifier and is traversed by a read current. The read current causes a voltage drop at the resistor which is transferred to a current accommodation network which controls the reference potential.

The invention has the major advantage that the current-voltage characteristic of the storage cells varying chip to chip per wafer will be fully compensated. By this approach, each storage cell can be actuated by the maximum possible cell current whereby the shortest possible access and write times can be obtained. Due to the fact that the variation range of the characteristics of the individual storage cells on an individual chip is rather small, it is possible by means of the additional integration of a simulation storage cell to actuate this storage cell in place of the other storage cells. By simulation of its characteristics by means of a control circuit it can be assumed that this simulation is also valid for the remaining storage cells of the chip.

One embodiment of the invention is illustrated in the drawings and is further explained in the following by using an example.

DESCRIPTION OF THE PREFERRED EMBODIMENTS

Figure 1:
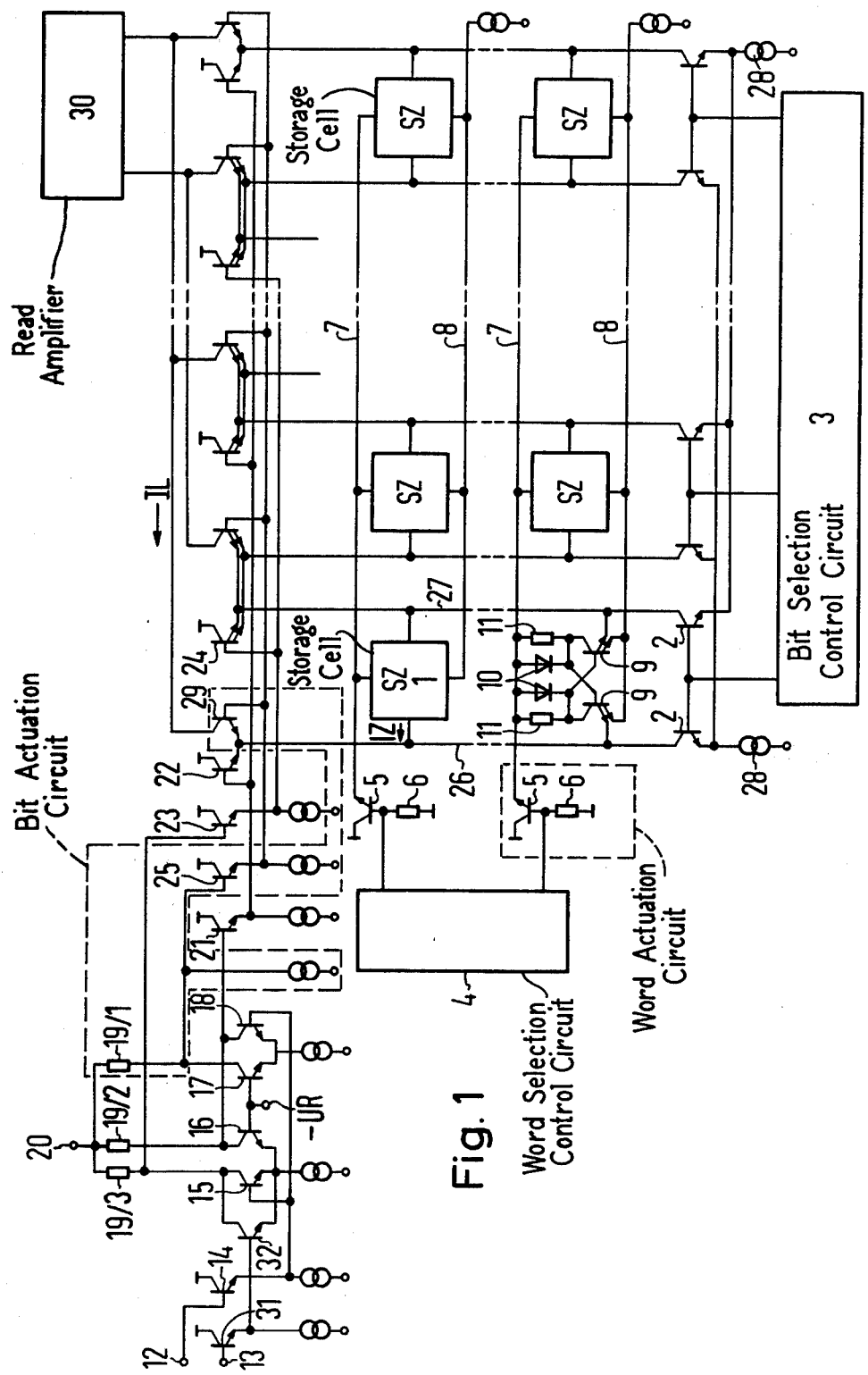
FIG. 1 illustrates a simplified block circuit diagram of a write-read integrated circuit in bipolar technique.

In the circuit arrangement as illustrated in FIG. 1 of a write-read memory building block in bipolar technique for the selection of a storage cell SZ, for example of the storage cell (SZ-1), switch transistors (2) are directed by means of a bit selection circuit (3) into a conductive mode. Simultaneously, a word addressing is accomplished by means of a word selection control circuit (4) in conjunction with the switch transistor (5) and the corresponding resistor (6) such that an upper word line (7) is switched to approximately $-0.9$ Volts which causes the lower word line (8) to adjust to a potential of approximately $-1.7$ Volts.

By means of this activation procedure, one single storage cell is therefore addressed, in this case the storage cell SZ-1. The storage cell itself consists of two linked up npn transistors having double emitters (9) which are connected in traditional fashion by diodes (10) and resistors (11) to each other.

In order to read out the information contained in such a storage cell (SZ), the storage cell (SZ) is addressed by means of the write-read control using the write input (12) and the data input (13).

In the operational mode "read", the write input (12) is set to a potential corresponding to a logic "1" by means of a known circuit arrangement which is not further illustrated here.

The transistor (14) connected to write input 12 switches two following differential amplifiers (transistors 15, 16, 32 and 17, 18) arranged as threshold switches with the reference voltage source (UR). By means of the voltage drop realized at the resistors (19) connected between the reference potential source (20) and transistors (21) and (23) on the one hand, as well as by the voltage drop at resistor 19/1 which is also connected between reference potential source (20) and transistor (25) (which is approximately a 0.4 Volt smaller voltage drop) on the other hand, the transistors (22) and (24) are blocked causing the potential at the bit lines (26) and (27) to adjust to approximately $-2.1$ Volt. The emitter of the conducting transistor of the selected storage cell (SZ01) which connects to the lower word line (8) is thereby blocked such that the entire cell current (IZ) is flowing into the bit line (26) belonging to it. Because the current in the bit lines (26) and (27) is impressed by means of the current sources (28) and therefore stays unchanged, the read current (IL) coming from the read amplifier (30) is reduced by the cell current IZ when the read transistor (29) is opened by the transistor (25). In order to reach optimum switching and access properties of a storage cell, the read current (IL) should be eliminated if possible so as to make the cell current (IZ) passing through the storage cell a maximum.

In analogy to the earlier explained operational mode "read", the write input (12) has in the operational mode "write" a potential corresponding to the logic state "0". If, for example, a "1" should be written into memory, the data input (13) has a potential corresponding to the logic state "1", causing the switch transistor (32) to open by means of transistor (31). Therefore, by way of the write-read control circuit, the potentials at the bit lines (26) and (27) differ from each other by approximately 0.4 Volts such that when writing a "1", the bit line (26) will indicate approximately −1.7 Volts and the bit line (27) approximately −2.5 Volts.

Figure 3:
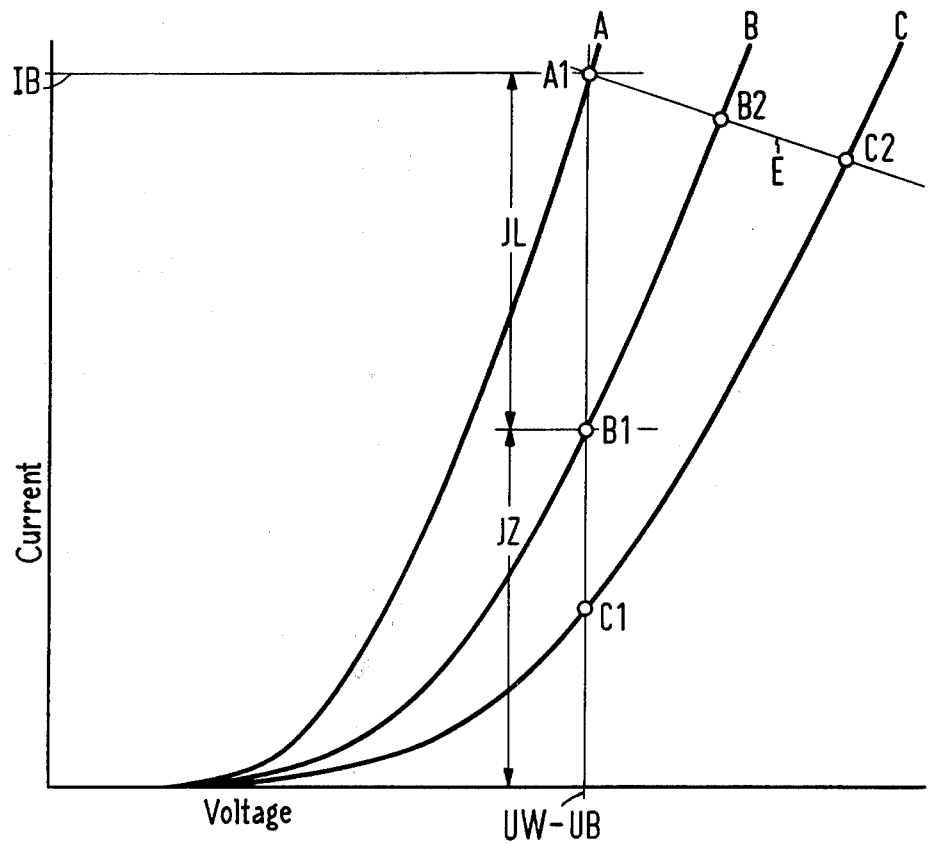
FIG. 3 illustrates a schematic representation of the operation of the control circuit by means of the current voltage characteristics of several storage cells.

The current voltage characteristic curves of the storage cells as illustrated in FIG. 3 show the dependence of the cell current (ordinate) and the operating voltage of the storage cell (abscissa) as they vary from chip to chip. Because the bit current (IB) is impressed by the current source (28) in the case of different shapes of the current-voltage characteristics, a differing amount of read current IL and of the cell current IZ will result. For example, in the operating mode "read", if the upper word line (7) has the selection potential UW=0.9 Volt and the bit lines (26) and (27) the rated potential UB=−2.1 Volt, one can find for the characteristic curves A,B, and C three operating points $A_1$, $B_1$ and $C_1$. The operating point $A_1$ of the characteristic curve A represents in this example the ideal case. When addressing a storage cell with such a characteristic, the entire bit current IB passes in the form of cell current IZ through the storage cell. This makes minimum writing and access times possible. In the case of the operating point $B_1$ of the curve B, a shift can already be determined for the operating point at the rated potential UB. Here the bit current IB is separated into approximately equal portions of read current IL and of cell current IZ. This causes the time characteristics of this storage cell to be considerably worse. If the current-voltage characteristic has a shallower slope, as shown in the characteristic curve C, a working point $C_1$ results and with it a further reduction of the cell current IZ. The reduction of the cell current IZ has the effect of an increase in access and specifically in write time.

Figure 2:
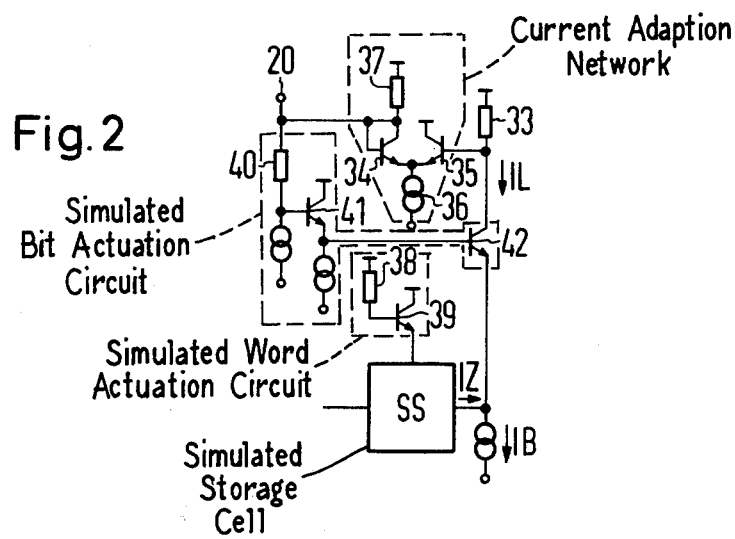
FIG. 2 illustrates a block circuit diagram of the control circuit in accordance with this invention.

With the aid of the control circuit in accordance with this invention and illustrated in FIG. 2, the reference potential (20) and thereby the cell potential of the respective cell characteristic can be adapted such that the operating points corresponding to the illustration of FIG. 3 are shifted from $B_1$ to $B_2$ of the characteristic curve B and from $C_1$ to $C_2$ of the characteristic curve C. Changes of the reference potential (20) correspond to changes of the potentials of the bit lines derived from this reference potential.

The control circuit in accordance with this invention consists of an additional storage cell SS integrated on the chip which serves as a simulation storage cell and is constructed in analogous fashion to the rest of the storage cells. The control circuit is actuated by means of a duplicate of the network for the word and bit actuation arrangement which corresponds in its construction exactly to the write-read control circuit in the operational mode "read". In addition, there is in the bit line branch to a simulated read amplifier an adjustable resistor (33) which is passing the read current IL. A voltage drop caused by the read current in this resistor is fed to a current adaptor network consisting of the transistors (34) and (35), a current source (36), and a resistor (37). The network controls the reference potential (20) and for this purpose, the two circuits of FIG. 1 and FIG. 2 are electrically connected by means of the reference potential (20).

In detail, the control circuit functions as follows. A copy of the word actuation circuit is provided as follows: resistor (38) corresponds to resistor 6 and transistor (39) corresponds to transistor 5. A copy of the bit actuation circuit is provided as follows: resistor (40) corresponds to resistor 19/1, transistor (41) corresponds to transistor 25, and transistor (42) corresponds to 29. With corresponding current sources and a storage cell SS, the current IL flowing through the read transistor (42), (corresponds to 29) is evaluated; the voltage drop of this current at the adjustable resistor (33) is fed by means of a current adaptor network to the bit actuating circuit as well as to its imitation in the control circuit by means of the resistors (19), (40). If, for example, initially the bit line rated potential UB is fed to the storage cell having the characteristic curve B, the current IL in the adjustable resistor (33) shifts the bit line potential to more negative values until the point of intersection between the cell characteristic curve and the control line (E) illustrated here has been reached (Operating point B2).

At this point, the shift of the reference potential and of the bit line potential corresponds for the cell characteristic in question to the voltage drop of the current IL along the adjustble resistor (33).

Due to the control circuit, it is possible, therefore, even in the case of widely varying cell characteristics, to have nearly all the impressed bit current IB pass through the selected cell so as to achieve the shortest possible access and write times.

By the use of only one individual control circuit per memory chip, the optimum actuating voltages for the storage cells can be obtained after the operating voltage has been switched on. This makes it possible without very great risk to follow through with the development of a memory circuit before the current-voltage characteristics of the final storage cell have been evaluated by measuring techniques. Therefore, the total development time for having a functional IC circuit on hand can be shortened. The variations of the cell characteristics from chip to chip of a wafer and from wafer to wafer are compensated for by the control circuit and thus shortest possible access and write times are accomplished.

In all, larger variations of cell characteristics can be tolerated, and by means of the control circuit, cells with a large internal resistance also will receive sufficient current.

In place of the simulation of the read amplifier by way of the adjustable resistor (33) there is also the possibility of obtaining the control voltage individually for each storage cell directly in the read amplifier of the memory IC and therefore also compensate for the variations of the storage cells on one individual chip.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A bipolar memory integrated circuit, comprising:
   (a) a plurality of storage cells addressable by bit and word lines;
   (b) a write-read control circuit means for changing information content of the storage cells via the bit lines;
   (c) a reference potential and a cell operating potential derived from the reference potential;
   (d) each storage cell having a current-voltage characteristic curve and an operating point thereon controlled by the cell operating potential; and
   (e) reference potential control circuit means having a simulation storage cell substantially identical in construction to and having all the components of the other storage cells, said reference potential control circuit means regulating the storage cells via the reference potential such that a cell current passing through a storage cell when the storage cell is addressed is substantially independent of manufacturing related variations of the characteristic curve of the addressed storage cell.

2. The circuit of claim 1 further comprising:
   a word actuation circuit and a bit actuation circuit connecting to the storage cells, a read amplifier means for supplying read current via the bit lines; and
   said reference potential control circuit means having a simulated word driver circuit and a simulated bit driver circuit as an imitation of the word and bit driver circuits, and read current means connected to the simulated bit driver circuit for simulating the read current, said read current means being connected to a current adaption network means for regulating the reference potential.

3. The circuit of claim 2 wherein the simulation storage cell is provided together with the simulated word and bit driver circuits in the form of one element of a chip of the bipolar memory circuit.

4. The circuit of claim 2 wherein the read current means for simulating the read current comprises an adjustable resistor causing a voltage drop which is coupled to the current adaption network means.

5. The circuit of claim 2 wherein the read current means comprises means for taking a control voltage related to read current from the read amplifier and connecting it to the current adaption network means.

6. A control circuit for controlling storage cell currents in a bipolar memory integrated circuit, said integrated circuit including a plurality of storage cells addressable by bit and word lines, comprising:
   (a) a reference potential and a cell operating potential derived therefrom;
   (b) each storage cell having a current-voltage characteristic curve and an operating point thereon controlled by the cell operating potential; and
   (c) reference potential control circuit means having a simulation storage cell substantially identical in construction to and having all the components of the other storage cells, said reference potential control circuit means regulating the storage cells via the reference potential such that a cell current of each of the cells which are addressed is of a substantially predetermined common value so as to provide shorter and uniform cell operating times independent of the storage cell current-voltage characteristic curve.

* * * * *